US006933229B2

(12) United States Patent
Kuan et al.

(10) Patent No.: US 6,933,229 B2
(45) Date of Patent: Aug. 23, 2005

(54) METHOD OF MANUFACTURING SEMICONDUCTOR DEVICE FEATURING FORMATION OF CONDUCTIVE PLUGS

(75) Inventors: Shih-Fan Kuan, Taoyuan (TW); Kuo-Chien Wu, Miaoli (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/605,306

(22) Filed: Sep. 22, 2003

(65) Prior Publication Data

US 2005/0012218 A1 Jan. 20, 2005

(30) Foreign Application Priority Data

Jul. 14, 2003 (TW) ....................................... 92119109 A

(51) Int. Cl.[7] ........................................... H01L 21/4763
(52) U.S. Cl. ....................... 438/638; 438/639; 438/640; 438/675
(58) Field of Search ................................ 438/595, 638, 438/639, 640, 672, 675; 257/775

(56) References Cited

U.S. PATENT DOCUMENTS 5,565,372 A * 10/1996 Kim ........................... 438/253
6,066,555 A * 5/2000 Nulty et al. ................ 438/634
6,235,593 B1 * 5/2001 Huang ........................ 438/279
6,806,187 B2 * 10/2004 Graettinger et al. ........ 438/675
2002/0105089 A1 * 8/2002 Tanaka ....................... 257/774
2003/0077909 A1 * 4/2003 Jiwari ........................ 438/710

* cited by examiner

*Primary Examiner*—Stephen W. Smoot
(74) *Attorney, Agent, or Firm*—Jianq Chyun IP office

(57) ABSTRACT

A semiconductor device and method of manufacturing the same are disclosed. A conductive structure, spacers and a dielectric layer are formed on a substrate. Thereafter, a portion of the cap layer, a portion of the spacers and a portion of the dielectric layer of the conductive structure are removed to form a funnel-shaped opening. The shoulder section of the conductive layer exposed by the funnel-shaped opening is removed to form a shoulder recess. A liner layer is formed on the sidewall of the funnel-shaped opening and then a bottom plug is formed inside the funnel-shaped opening. Another dielectric layer is formed over the substrate. A top plug is formed in the dielectric layer such that the top plug and the bottom plug are electrically connected. Finally, a wire line is formed over the substrate.

12 Claims, 4 Drawing Sheets

METHOD OF MANUFACTURING SEMICONDUCTOR DEVICE FEATURING FORMATION OF CONDUCTIVE PLUGS

CROSS REFERENCE TO RELATED APPLICATIONS

This application claims the priority benefit of Taiwan application serial no. 92119109, filed on Jul. 14, 2003.

BACKGROUND OF INVENTION

1. Field of the Invention

The present invention relates to an integrated circuit and fabricating method thereof. More particularly, the present invention relates to a semiconductor device and method of fabricating the same.

2. Description of the Related Art

Typically, integrated circuit devices are interconnected via metal interconnects. The conventional method of fabricating metal interconnects includes forming a metal plug in a dielectric layer and then forming a metal line over a substrate to connect with the metal plug. FIG. 1 is a top view showing the layout of conventional metal interconnects. As the level of integration for semiconductor devices continues to increase, the aspect ratio of contact openings must be reduced to avoid difficulties encountered while carrying out etching and material deposition. At present, the contact plug 20 in FIG. 1 has a critical dimension greater than the metal line 10 so that more metal lines 10 can be packed within the limited surface area of a chip.

With the contact plug 20 having a larger critical dimension, the alignment tolerance in the process of forming the contact opening is greatly reduced. Should an alignment error occur, a neighboring conductive structure such as the conductive layer of a gate structure may be exposed leading to a possible short circuit between a subsequently formed contact plug and the conductive structure.

Furthermore, with the critical dimension of the contact plug 20 greater than the metal line 10 and the pitch between neighboring metal line 10 reduced, the overlay tolerance in photolithographic processing of the metal lines 10 is relatively small. Any minor misalignment will likely lead to an unwanted electrical connection or short-circuit between a metal line 10 and a neighboring plug.

SUMMARY OF INVENTION

Accordingly, the present invention is to provide a semiconductor device and manufacturing method thereof for increasing overlay tolerance of metal interconnects.

This invention is to provide a semiconductor device and manufacturing method thereof for preventing a short circuit between a contact plug and a neighboring conductive structure.

To achieve these and other advantages and in accordance with the purpose of the invention, as embodied and broadly described herein, the invention provides a method of manufacturing a semiconductor device. First, a conductive structure, spacers and a dielectric layer are formed over a substrate. Thereafter, a portion of the cap layer of the conductive structure, a portion of the spacer and a portion of the dielectric layer are removed by etching to form a funnel-shaped opening. The shoulder portion of the conductive layer within the conductive structure exposed by the funnel-shaped opening is removed to form a shoulder recess. A liner layer is formed on the sidewall of the funnel-shaped opening and then a bottom plug is formed in the funnel-shaped opening. Afterwards, another dielectric layer is formed over the substrate. A top plug is formed in the dielectric layer such that the top plug and the bottom plug are electrically connected. Finally, a wire line is formed on the upper surface of the substrate.

In this invention, the contact/via plug is fabricated by combining two sections together, namely, a bottom plug and a top plug. With this setup, the aspect ratio of the contact/via opening in the process of forming the contact/via is very much reduced. Hence, the process of etching out contact/via openings and the deposition of conductive material into the opening thereafter is greatly simplified.

Because the top plug has a critical dimension smaller than the junction portion of the funnel shaped bottom plug, the alignment tolerance with respect to the bottom plug in the photolithographic process for forming the top plug opening is increased. Furthermore, with the top plug having a smaller critical dimension, the wire lines above the top plugs can have a larger alignment tolerance so that the probability of having a short circuit due to misalignment is lowered considerably.

In addition, the shoulder chamfer or shoulder recess in the conductive layer of the conductive structure permits the formation of a thicker liner layer in this area. Therefore, the section between the bottom plug and the conductive layer, in particular, between the conductive layer and the shoulder section can have a thicker isolating liner layer for preventing plug/conductive layer short circuit.

This invention also provides a semiconductor device. The semiconductor device comprises a plurality of conductive structures, a plurality of bottom plugs, a plurality of top plugs, a plurality of wire lines, a liner layer and a dielectric layer. The conductive structures are formed over a substrate. The bottom plugs have a funnel shape. Furthermore, the bottom plugs are positioned between neighboring conductive structures and are electrically connected to the substrate. The liner layer is set up between the neighboring conductive structures and the bottom plug. The top plug is set up over the bottom plug. The junction between the bottom plug and the top plug has a critical dimension greater than the top plug. The wire lines are electrically connected to the respective top lugs. The dielectric layer is set up between the conductive structures, between the bottom plugs, between the top plugs and between the wire lines.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
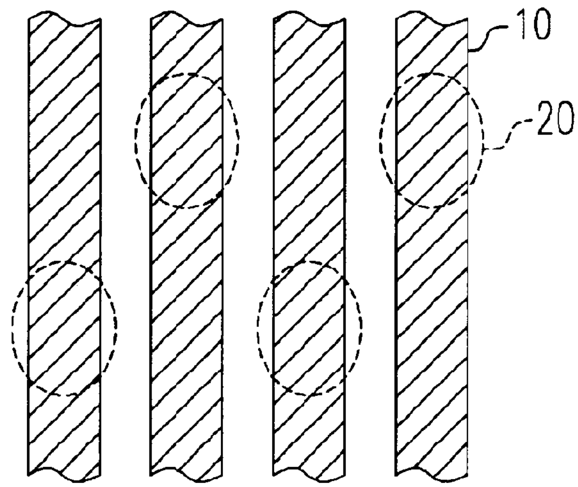
FIG. 1 is a top view showing the layout of conventional metal interconnects.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
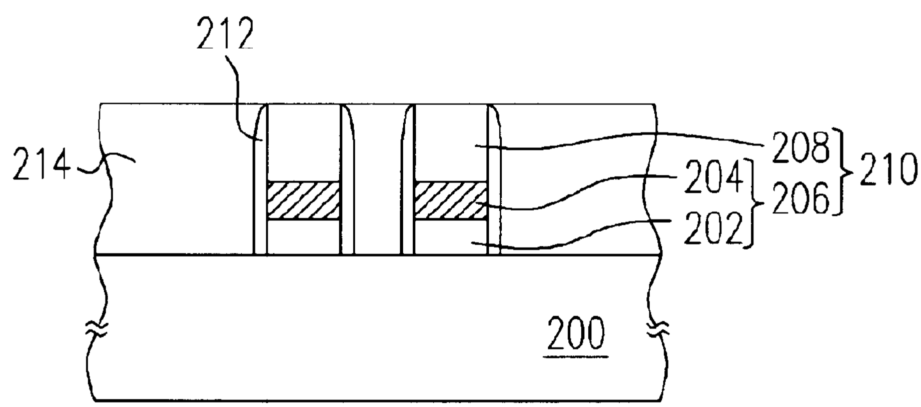
FIGS. 2A through 2F are schematic cross-sectional views showing the progression of steps for fabricating metal interconnects according to one preferred embodiment of this invention.

FIGS. 2A through 2F are schematic cross-sectional views showing the progression of steps for fabricating metal interconnects according to one preferred embodiment of this invention. As shown in FIG. 2A, a plurality of conductive structures 210 is formed over a substrate 200. Each conductive structure 210 at least comprises a conductive layer 206 and a cap layer 208. The conductive layer 206 further comprises a polysilicon layer 202 and a metal silicide layer 204, for example. The cap layer 208 is a silicon nitride layer, for example. Thereafter, spacers 212 are formed on the sidewalls of the conductive structures 210. The spacers 212 are silicon nitride layers formed by performing a chemical vapor deposition operation, for example. A dielectric layer 214 is formed over the substrate 100. The dielectric layer 214 is formed, for example, by depositing dielectric material over the cap layer 208 and into the space between the spacers on the conductive structures 210. This is followed by performing a chemical-mechanical polishing to remove the dielectric material above the cap layer 208. The dielectric layer 214 is fabricated using silicon oxide or borophosphosilicate glass (BPSG), for example.

Figure 2B:
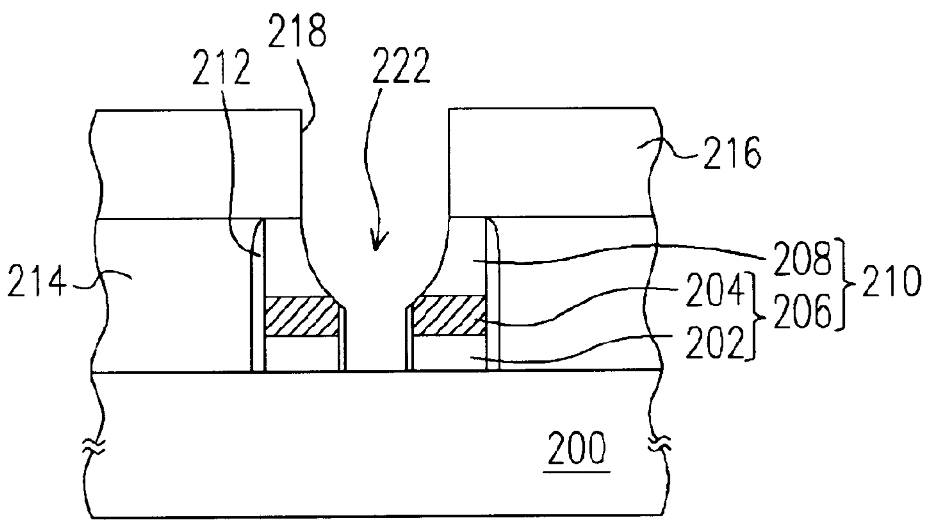

As shown in FIG. 2B, a photoresist layer 216 is formed over the substrate 200. The photoresist layer 216 has an opening 218 that exposes the dielectric layer 214 between two neighboring conductive structures 210. Using the photoresist layer 216 as an etching mask, an anisotropic etching operation is carried out using an etchant having a high selectivity ratio between the dielectric layer 214 and the cap layer 208. Ultimately, the exposed dielectric layer 214 and a portion of the cap layer 212 and the spacers 212 are removed so that the shoulder section such as the metal silicide layer 204 of the conductive layer 206 is exposed. Because the etchant has a high etching selectivity ratio between the dielectric layer 214 and the cap layer 208/the spacers 212, a low etching rate for the cap layer 208 and the spacers 212 but a high etching rate for the dielectric layer 214, the opening 222 has a funnel shape after the etching operation.

Figure 2C:
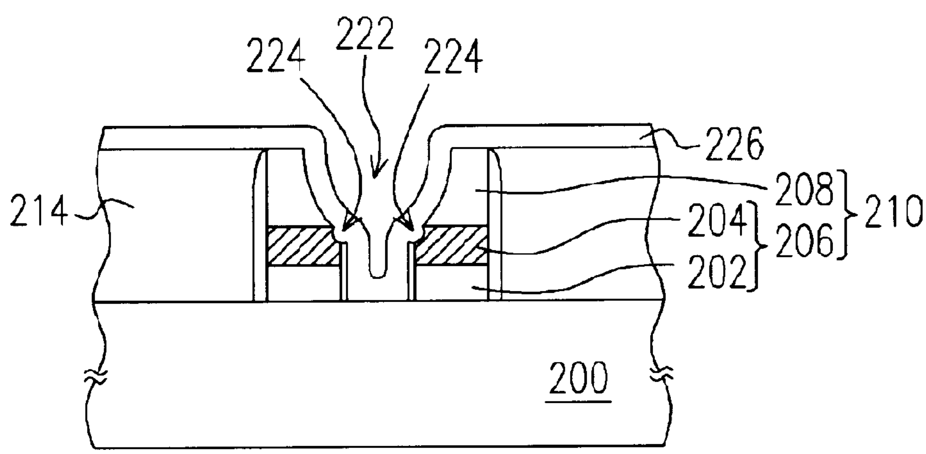

As shown in FIG. 2C, the photoresist layer 216 is removed. A portion of the exposed conductive layer 206, that is, the shoulder portion of the metal silicide layer 204 is removed so that a shoulder chamfer or a shoulder recess 224 is formed. Thereafter, a liner material layer 226 is formed over the substrate 200 to cover the dielectric layer 214, the cap layer 208 and the sidewall and bottom section of the funnel-shaped opening 222. The liner material layer 226 is fabricated using an insulating material such as silicon nitride or silicon oxide. The liner material layer 226 is formed, for example, by performing a chemical vapor deposition. Preferably, the liner material layer 226 is fabricated using a material that differs from a subsequently formed dielectric layer 230.

Figure 2D:
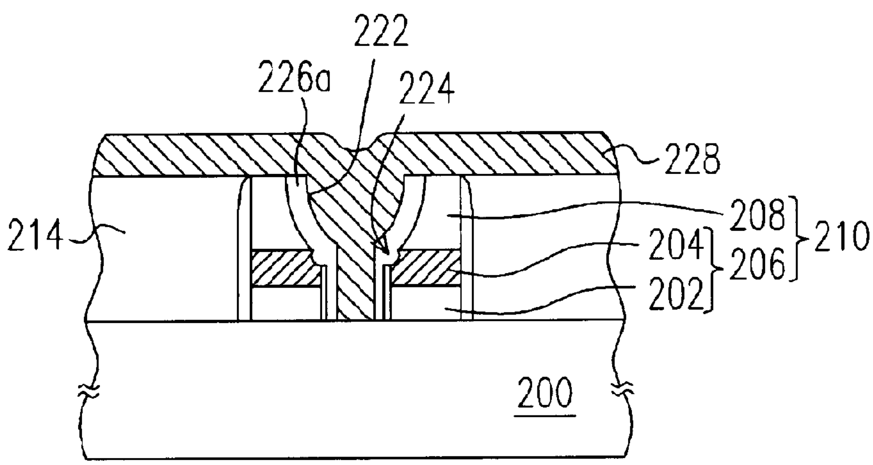

As shown in FIG. 2D, an anisotropic back etching is carried out to remove the liner material layer 226 over the dielectric layer 214 and the cap layer 208 and at the bottom of the funnel-shaped opening 222. The liner material layer **226*a* on the sidewalls of the funnel-shaped opening 222 is retained to serve as a liner layer. Since the conductive layer 206 has a shoulder chamfer or a shoulder recess 224, the liner layer 226*a* at the shoulder section of the conductive layer 206 is the thickest. Thereafter, a conductive layer 228 is formed over the substrate to cover the dielectric layer 214 and the conductive structure 210 and fill the funnel-shaped opening 222. The conductive layer 228** is fabricated using a metal material including tungsten or doped polysilicon, for example.

Figure 2E:
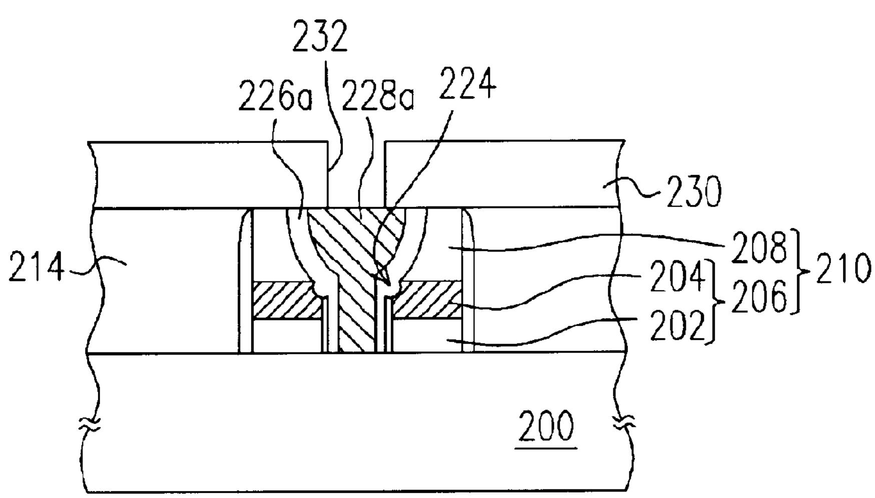

As shown in FIG. 2E, a chemical-mechanical polishing operation is performed to remove the conductive layer 228 above the dielectric layer 214 and the conductive structure 210. Hence, a conductive layer **228*a* is retained within the funnel-shaped opening 222 to form a bottom plug. Thereafter, the dielectric layer 230 is formed over the substrate 200. The dielectric layer 230 has an opening 232 that exposes a portion of the bottom plug 228*a*. The opening 232 has a critical dimension smaller than the open end of the funnel-shaped opening 222. The dielectric layer 230 is a silicon oxide layer formed, for example, by performing a chemical vapor deposition. In general, the liner layer 226*a* is fabricated using a material that differs from the dielectric layer 230. Thus, even if there is some misalignment when the opening 232 is formed via a photolithographic process, the liner layer 226*a* may serve as an etching stop layer to prevent any over-etching in processing the dielectric layer 230**.

Figure 2F:
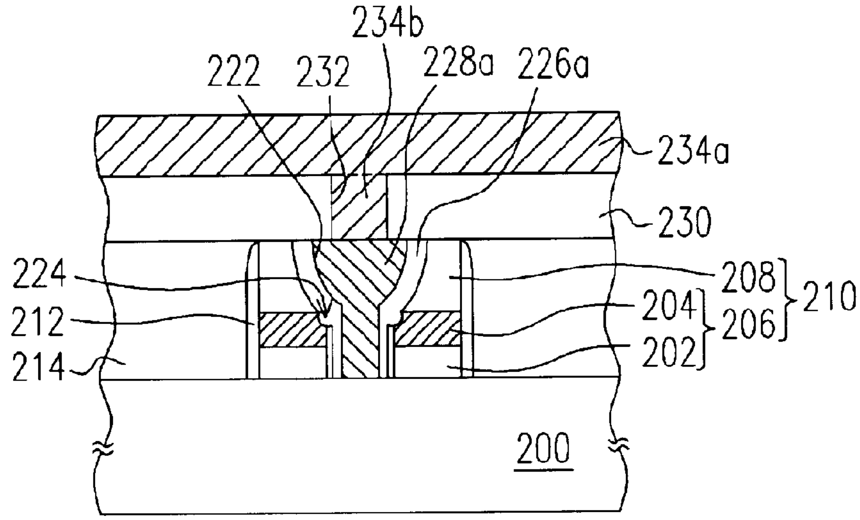

As shown in FIG. 2F, another conductive layer is formed over the substrate 200 to cover the dielectric layer 230 and fill the opening 232. The conductive layer inside the opening 232 forms a top plug **234*b*. The conductive layer is fabricated using a metal material including, tungsten or doped polysilicon layer, for example. Thereafter, photolithographic and etching processes are carried out to pattern the conductive layer and form a plurality of wire lines 234*a***.

Figure 3:
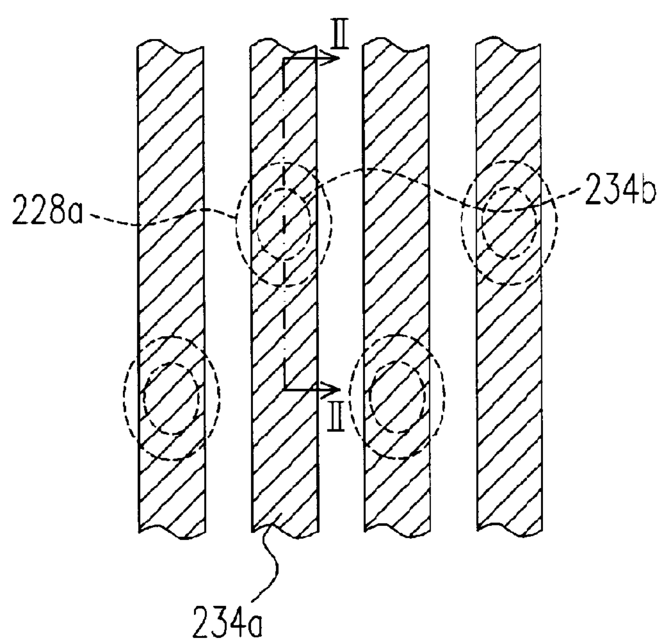
FIG. 3 is a top view of FIG. 2F.

FIG. 2F is a schematic cross-sectional view of a semiconductor device structure according to a preferred embodiment of this invention. FIG. 3 is a top view of FIG. 2F. As shown in FIGS. 2F and 3, the semiconductor device comprises a plurality of conductive structures 210, a plurality of bottom plugs **228*a*, a plurality of top plugs 234*b*, a plurality of wire lines 234*a*, a liner layer 226*a* and a pair of dielectric layers 214 and 230. The conductive structures 210 are formed over a substrate 200. The bottom plugs 228*a* is a solid block with a funnel shape. The bottom plugs 228*a* are positioned between neighboring conductive structures 210 and electrically connected to the substrate 200. The liner layer 226*a* is set up between neighboring conductive structures 210 and the bottom plugs 228*a*. The top plugs 234*b*, which are solid blocks with a cylindrical shape, are set up over the respective bottom plugs 228*a*. The junction portion of the bottom plug 228*a* connected to the top plug 234*b* has a critical dimension greater than the top plug 234*b*. The wire lines 234*a* are electrically connected to respective top plugs 234*b*. The dielectric layer 214 is set up between the conductive structures 210 and between the bottom plugs 228*a*. The dielectric layer 230 is set up between the top plugs 234*b* and the wire lines 234*a***.

When this invention is applied to fabricate a memory device, the conductive structures 210 are gate structures that comprises a gate dielectric layer (not shown), a polysilicon layer 202, a metal silicide layer 204 and a cap layer 208. In this case, the wire lines **234*a* are bit lines and the top plug 234*b* and the bottom plug 228*a*** together constitute a bit line contact.

In this invention, the contact/via plug is formed by combining two plug sections together, namely, a bottom plug **228*a* and a top plug 234*b*. With this setup, the aspect ratio of the contact/via opening in the process of forming the contact/via is reduced. Hence, the process of etching out contact/via openings and the deposition of conductive material into the opening thereafter is very much simplified. Note also that an anisotropic etching process is performed to remove a portion of the dielectric layer 214, the cap layer 208 and the spacers 212 and form a funnel-shaped opening 222. Since the funnel-shaped opening 222 has a critical dimension larger than the opening 232, the photolithographic process for forming the opening 232 in the dielectric layer 230 can have a higher alignment tolerance with respect to the bottom plug 228***a*. Furthermore, with the opening 232 having a smaller critical dimension, the wire lines 234*a* above the top plugs 234*b* can have a larger alignment tolerance so that the probability of having a short circuit due to misalignment is lowered considerably.

In addition, the shoulder chamfer or shoulder recess 224 in the conductive layer 206 of the conductive structure 210 permits the formation of a thicker liner layer 226*a* in this area. Thus, the section between the bottom plug 228*a* and the conductive layer 206, in particular, between the conductive layer 206 and the shoulder section can have a thicker isolating liner layer 226*a* for preventing plug/conductive layer short circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device, comprising the steps of:

providing a substrate;

forming a plurality of conductive structures over the substrate, wherein each conductive structure comprises a conductive layer and a cap layer over the conductive layer;

forming spacers on sidewalls of the conductive structures;

forming a first dielectric layer over the substrate;

removing a portion of the first dielectric layer, a portion of the cap layer and a portion of the spacers between neighboring conductive structures to form a plurality of first openings;

forming a liner layer over a bottom and sidewalls of the first openings;

forming a bottom plug over the liner layer in the first openings;

forming a second dielectric layer over the substrate;

forming a plurality of second openings in the second dielectric layer, wherein each second opening exposes a portion of the bottom plug, and the second opening has a critical dimension smaller than the first opening;

forming a top plug inside the second openings; and forming a plurality of wire lines over the second dielectric layer so that the wire lines and the top plugs are electrically connected.

2. The method of claim 1, wherein the first opening has a funnel shape.

3. The method of claim 2, wherein the step of forming the funnel shape opening comprises performing an anisotropic etching operation to remove a portion of the first dielectric layer, a portion of the cap layer and a portion of the spacers between neighboring conductive structures, moreover, the anisotropic etching process uses an etchant with a high etching selectivity between the first dielectric layer and the cap layer/the spacers, a low etching rate for the cap layer/spacer layer but a high etching rate for the first dielectric layer.

4. The method of claim 1, wherein the step of forming the liner layer on the bottom and the sidewalls of the first openings comprises:

forming a liner material layer over the substrate to cover the first dielectric layer, the conductive structures and the sidewalls and bottom of the first openings; and performing an anisotropic etching of the liner material layer to form the liner layer on the sidewalls of the first openings.

5. The method of claim 4, wherein material constituting the liner material layer is different from the second dielectric layer.

6. The method of claim 1, wherein the step for forming the top plugs and the wire lines further comprises:

forming a second conductive layer over the substrate to cover the second dielectric layer and fill the second openings, wherein the second conductive layer within the second openings form the top plug; and patterning the second conductive layer to form the wire lines.

7. A method of manufacturing a semiconductor device, comprising the steps of:

providing a substrate;

forming a plurality of conductive structures over the substrate, wherein each conductive structure comprises a conductive layer and a cap layer over the conductive layer;

forming spacers on sidewalls of the conductive structures;

forming a dielectric layer over the substrate;

removing a portion of the dielectric layer, a portion of the cap layer and a portion of the spacers between neighboring conductive structures to form a plurality of openings that exposes a shoulder section of the conductive layers;

removing the shoulder section of the conductive layers to form a shoulder recess;

forming a liner layer on bottom and sidewalls of the openings; and forming a conductive plug over the liner inside the openings.

8. The method of claim 7, wherein the opening has a funnel shape.

9. The method of claim 8, wherein the step of forming the funnel shape opening comprises performing an anisotropic etching operation to remove a portion of the dielectric layer, a portion of the cap layer and a portion of the spacers between the conductive structures, moreover, the anisotropic etching process uses an etchant with a high etching selectivity between the dielectric layer and the cap layer/the spacers, a low etching rate for the cap layer/spacer layer but a high etching rate for the dielectric layer.

10. The method of claim 7, wherein the step of forming the liner layer on the sidewalls of the openings comprises:

forming a liner material layer over the substrate to cover the dielectric layer, the conductive structures and the sidewalls and bottom section of the openings; and performing an anisotropic etching of the liner material layer to form a liner layer on the sidewalls of the openings.

11. The method of claim 10, wherein material constituting the liner material layer is different from the dielectric layer.

12. A method of manufacturing a conductive plug over a substrate, the substrate comprising a plurality of conductive structures formed thereon, wherein each conductive structure comprises a conductive layer, a cap layer over the conductive layer and spacers on sidewalls thereof, the method comprising:

forming a first dielectric layer over the substrate;

forming a plurality of first openings between the conductive structures, wherein a recess is formed on sidewalls of the first openings proximate to a shoulder of the conductive structures;

forming a liner layer over a bottom and sidewalls of the first openings;

forming a bottom plug over the liner layer in the first openings;

forming a second dielectric layer over the substrate;

forming a plurality of second openings in die second dielectric layer, wherein each second opening exposes a portion of the bottom plug;

forming a top plug inside the second openings; and forming a plurality of wire lines over the second dielectric layer so that the wire lines and the top plugs are electrically connected.

* * * * *